United States Patent
Sakaguchi

(10) Patent No.: US 10,006,958 B2
(45) Date of Patent: Jun. 26, 2018

(54) SEMICONDUCTOR DEVICE AND METHOD OF INSPECTING A SEMICONDUCTOR DEVICE

(71) Applicant: SII Semiconductor Corporation, Chiba-shi, Chiba (JP)

(72) Inventor: Kaoru Sakaguchi, Chiba (JP)

(73) Assignee: ABLIC INC., Chiba (JP)

( * ) Notice: Subject to any disclaimer, the term of this patent is extended or adjusted under 35 U.S.C. 154(b) by 132 days.

(21) Appl. No.: 15/335,941

(22) Filed: Oct. 27, 2016

(65) Prior Publication Data
US 2017/0122997 A1 May 4, 2017

(30) Foreign Application Priority Data
Oct. 28, 2015 (JP) .................................. 2015-212166

(51) Int. Cl.
*G01R 31/02* (2006.01)
*G01R 31/26* (2014.01)
*G05F 3/26* (2006.01)

(52) U.S. Cl.
CPC ..... *G01R 31/2621* (2013.01); *G01R 31/2623* (2013.01); *G01R 31/2625* (2013.01); *G05F 3/262* (2013.01); *G01R 31/2626* (2013.01); *G01R 31/2628* (2013.01)

(58) Field of Classification Search
CPC ............ G01R 31/2621; G01R 31/2623; G01R 31/2625; G01R 31/2626; G01R 31/2628
USPC ......... 324/71, 378, 403, 415, 425, 500, 537, 324/762.01, 762.09
See application file for complete search history.

(56) References Cited

U.S. PATENT DOCUMENTS

| 2003/0025130 A1* | 2/2003 | Takahashi | G11C 5/14 257/200 |
| 2011/0032647 A1* | 2/2011 | Kawachi | H01L 27/0266 361/56 |
| 2015/0022248 A1* | 1/2015 | Fukami | H01L 27/0883 327/110 |

FOREIGN PATENT DOCUMENTS

JP 11-251912 A 9/1999

* cited by examiner

*Primary Examiner* — Jermele M Hollington
*Assistant Examiner* — Raul Rios Russo
(74) *Attorney, Agent, or Firm* — Brinks Gilson & Lione

(57) ABSTRACT

Provided is a semiconductor device including a MOS analog circuit which has a high reliability and a low manufacturing cost, and in which latent failure is easily detected. The MOS analog circuit is switched to a test state or an operating state based on a control signal that is externally supplied. In the test state, a voltage between a power supply terminal and a reference terminal is applied to a gate oxide film of a MOS transistor included in the MOS analog circuit.

3 Claims, 5 Drawing Sheets

SEMICONDUCTOR DEVICE AND METHOD OF INSPECTING A SEMICONDUCTOR DEVICE

RELATED APPLICATIONS

This application claims priority under 35 U.S.C. § 119 to Japanese Patent Application No. 2015-212166 filed on Oct. 28, 2015, the entire content of which is hereby incorporated by reference.

BACKGROUND OF THE INVENTION

1. Field of the Invention

The present invention relates to a semiconductor device including an analog circuit including a MOS transistor.

2. Description of the Related Art

Description is given of a semiconductor device including an analog circuit including a MOS transistor (hereinafter referred to as "MOS analog circuit") according to the related art.

As an example of the related-art MOS analog circuit, a current source circuit used in a digital-to-analog converter is illustrated in FIG. 5.

The current source circuit of FIG. 5 includes a current source 501, current mirror circuits 502 and 503, a load resistor 504, a switching circuit 505, a terminal 506, a power supply terminal 507, and a ground terminal 508.

The current mirror circuit 502 includes nMOS transistors 511 and 512, and the current mirror circuit 503 includes pMOS transistors 513 and 514. The switching circuit 505 is formed of a pMOS transistor, and opening and short-circuiting of the switching circuit 505 is controlled through a digital signal supplied by the terminal 506.

A current output by the current source circuit 501 is input to an input terminal 515 of the current mirror circuit 502, to thereby be output from an output terminal 516.

When the switching circuit 505 is in an OFF state, the current mirror circuit 503 is operated. Therefore, a current output from the output terminal 516 of the current mirror circuit 502 is input to an input terminal 517 of the current mirror circuit 503, and the mirrored current is output from an output terminal 518 thereof. The current output from the output terminal 518 of the current mirror circuit flows through the load resistor 504, and generates an analog signal voltage across both ends of the resistor 504.

Further, when the switching circuit 505 is in an ON state, the current mirror circuit 503 is stopped. That is, the pMOS transistors 513 and 514 are placed in an OFF state because a gate-source voltage Vgs becomes 0 V. Then, the current output from the output terminal 518 of the current mirror circuit 503 becomes 0. Therefore, the voltage generated across both ends of the load resistor 504 becomes 0.

As described above, the current source circuit of FIG. 5 is configured to generate an analog voltage, which corresponds to a digital signal supplied by the terminal 506, across both ends of the load resistor 504 (see, for example, Japanese Patent Application Laid-open No. Hei 11-251912).

Meanwhile, in recent years, industrial machines and in-vehicle devices have become increasingly computerized, and semiconductor components are being mounted on various electronic devices. For example, semiconductor devices using the MOS transistor tend to be increasingly used also inside automobiles in which high reliability is required under strict operating conditions.

In general, measures for achieving high reliability in the semiconductor device include removal of potentially defective products at a burn-in step before shipping. In the burn-in step, revealing failure is accelerated by operating the products under high-temperature and high-voltage conditions for a long period of time. However, there is a problem in that a manufacturing cost is increased and an accuracy is decreased due to the fact that, in order to actually perform a burn-in test, there needs to be prepared a testing environment in which high temperature and high voltage can be applied to the products.

Specifically, in the related-art MOS analog circuit, when the circuit is in an operating state, each MOS transistor inside the circuit is biased by a constant current. Thus, the gate-source voltage Vgs is low, being near Vth. Therefore, a high electrical field cannot be applied to a gate oxide film. As a result, when the gate oxide film includes latent defects that have a major impact on the reliability of the MOS transistor, a measure of placing the circuit under a high-temperature environment for a long period of time needs to be taken because the revealing the failure cannot be accelerated by the electrical field in the burn-in step. Consequently, there has been a problem in that a test facility is needed in order to take those measures, which leads to an increase in the cost of the burn-in test for the MOS analog circuit to be mounted on the electronic devices for which high reliability is required.

Further, in the MOS analog circuit, the current of an operating circuit flows based on a current value of a constant current source. Therefore, there has been a problem in that, even when a leakage current is generated due to the defects in a gate of the MOS transistor of the MOS analog circuit, there is a low possibility that the leakage current can be detected by measuring a current between the power supply terminal and the ground terminal.

SUMMARY OF THE INVENTION

The present invention has been made in view of the problems described above, and provides a semiconductor device including a MOS analog circuit, which has a high reliability and a low manufacturing cost, and in which latent failure is easily detected.

In order to solve the problems in the related art, according to one embodiment of the present invention, there is provided a semiconductor device, including: a MOS analog circuit including a MOS transistor; and a power supply terminal and a reference terminal for supplying a voltage to the MOS analog circuit, in which the MOS analog circuit is configured to switch to one of a test state and an operating state based on a control signal that is externally supplied, and in which, in the test state, a current path formed, when the MOS transistor is turned on, between the power supply terminal and the reference terminal is blocked, and a voltage between the power supply terminal and the reference terminal is applied to a gate oxide film of the MOS transistor.

Further, according to one embodiment of the present invention, there is provided a method of inspecting a semiconductor device, the semiconductor device including: a MOS analog circuit including a MOS transistor; and a power supply terminal and a reference terminal for supplying a voltage to the MOS analog circuit, the method including: switching, based on a control signal that is externally supplied, the MOS analog circuit to a test state in which a current path formed, when the MOS transistor is turned on, between the power supply terminal and the reference terminal is blocked, and a voltage between the power supply terminal and the reference terminal is applied to a gate oxide film of the MOS transistor; measuring a current flowing between the power supply terminal and the reference terminal; and detecting failure of the semiconductor device.

According to the present invention, the gate oxide film of the MOS transistor inside the MOS analog circuit can be applied with the high electrical field. Therefore, in the burn-in test, there is no need to place the MOS analog circuit under the high-temperature environment for a long period of time and the defects of the gate oxide film can be easily revealed by the high electrical field in a short period of time. As a result, the low manufacturing cost and the high reliability can be achieved. Further, there is an effect in that, when the leakage current is generated in the gate of the MOS transistor of the MOS analog circuit, the leakage current can be detected by measuring the current between the power supply terminal and the reference terminal, which facilitates the detection of the latent failure.

DETAILED DESCRIPTION OF THE PREFERRED EMBODIMENTS

Figure 1:
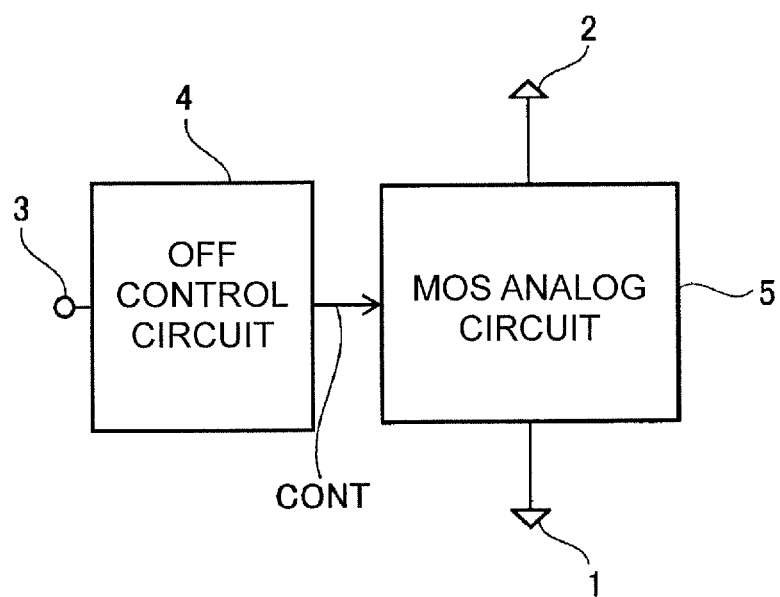
FIG. 1 is a block diagram for illustrating a semiconductor device of an embodiment of the present invention.

Now, an embodiment of the present invention is described referring to the drawings.

FIG. 1 is a block diagram for illustrating a semiconductor device of an embodiment of the present invention.

The semiconductor device of FIG. 1 includes a reference terminal 1 to which a reference voltage is supplied, a power supply terminal 2 to which a power supply voltage is supplied, a control terminal 3, an OFF control circuit 4, and a MOS analog circuit 5 including a plurality of MOS transistors.

The control terminal 3 is connected to the OFF control circuit 4. The OFF control circuit 4 is configured to output a control signal CONT to the MOS analog circuit 5. The MOS analog circuit 5 is connected to the reference terminal 1 and the power supply terminal 2.

An operation of the semiconductor device of FIG. 1 is described.

When a first signal is input to the control terminal 3, the OFF control circuit 4 outputs an ON signal as the control signal CONT to the MOS analog circuit 5. When the ON signal is input to the MOS analog circuit 5, the MOS analog circuit 5 is placed in an operating state.

When the MOS analog circuit 5 is in the operating state, each MOS transistor inside the MOS analog circuit 5 is biased by the constant current, and thus the gate-source voltage Vgs is low, being near Vth. For example, Vgs of an nMOS transistor that is biased to be in a strong inversion state or a saturation state is determined using a bias current Id, bias by the following expression (1):

$$I_{d,bias} = K \times (Vgs - Vth)^2 \qquad (1),$$

where Vth represents an ON threshold value of the transistor and K represents a constant determined through processing and W/L size of the transistor. Further, in general, the constant current is not so dependent on the power supply voltage. Therefore, even when the power supply voltage is changed, Vgs cannot be arbitrarily raised.

Next, when a second signal is input to the control terminal 3, the OFF control circuit 4 outputs an OFF signal as the control signal CONT to the MOS analog circuit 5. When the OFF signal is input to the MOS analog circuit 5, the MOS analog circuit 5 is placed in a test state.

When the MOS analog circuit 5 is in the test state, a voltage between the power supply terminal 2 and the reference terminal 1 is applied to the gate oxide film of each MOS transistor of the MOS analog circuit 5. In the burn-in test before shipping, through use of the test state, each gate oxide film can be simultaneously applied with the high electrical field, to enable the defects to be easily revealed in a short period of time. Further, the leakage current of the gate oxide film can be measured as the current flowing through the power supply terminal 2 (the reference terminal 1), thereby enabling the failure to be detected with high sensitivity.

Next, specific circuit configuration examples of the MOS analog circuit 5 in the semiconductor device of FIG. 1 are described with reference to FIG. 2 to FIG. 4. The same components as in FIG. 1 are denoted by the same numerals, and overlapping descriptions are abbreviated as appropriate.

Figure 2:
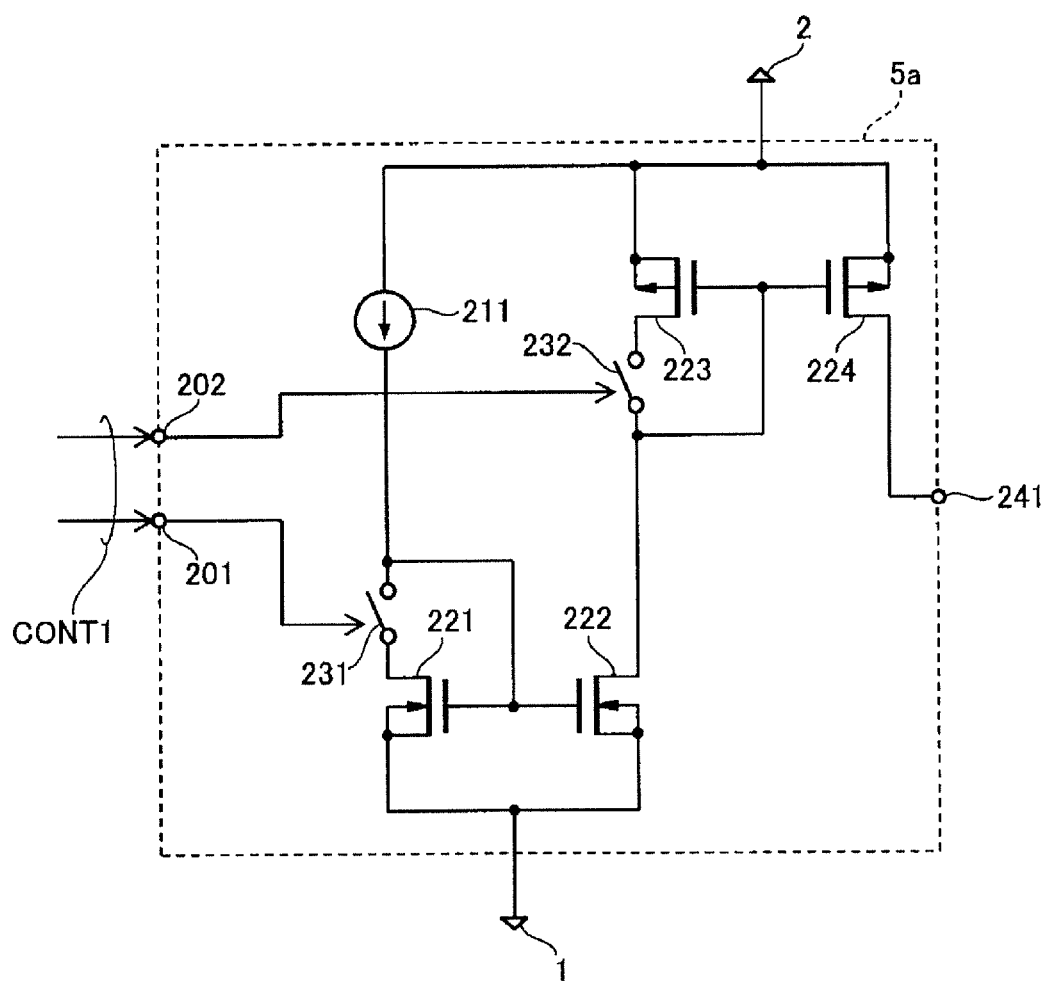
FIG. 2 is a circuit diagram for illustrating a MOS analog circuit 5a, which is an example of a MOS analog circuit of the semiconductor device of FIG. 1.

FIG. 2 is a circuit diagram for illustrating a MOS analog circuit 5a, which is an example of the MOS analog circuit 5 of the semiconductor device of FIG. 1.

The MOS analog circuit 5a of FIG. 2 includes control input terminals 201 and 202, a constant current source 211, nMOS transistors 221 and 222, pMOS transistors 223 and 224, switching circuits 231 and 232, and an output terminal 241.

The constant current source 211, the switching circuit 231, and the nMOS transistor 221 are connected in series between the power supply terminal 2 and the reference terminal 1. The pMOS transistor 223, the switching circuit 232, and the nMOS transistor 222 are connected in series between the power supply terminal 2 and the reference terminal 1. The pMOS transistor 224 has a source connected to the power supply terminal 2, a drain connected to the output terminal 241, and a gate connected to a gate of the pMOS transistor 223.

Further, a gate of the nMOS transistor 221 and a gate of the nMOS transistor 222 are connected to a node between the constant current source 211 and the switching circuit 231. The gate of the pMOS transistor 223 is connected to a node between the switching circuit 232 and the nMOS transistor 222.

A control signal CONT1 is input to the control input terminals 201 and 202 from the OFF control circuit 4 illustrated in FIG. 1, and the switching circuits 231 and 232 are controlled to be turned on and off through the control signal CONT1. Here, when each switching circuit is turned on, both ends thereof are in a short-circuited state, and when each switching circuit is turned off, both ends thereof are in an open state.

When the control signal CONT1 is an ON signal, the switching circuits 231 and 232 are both turned on to place the MOS analog circuit 5a in an operating state.

In the operating state, a current of the constant current source 211 is output to the pMOS transistor 223 at a predetermined current mirror ratio through a current mirror formed of the nMOS transistors 221 and 222. The pMOS transistors 223 and 224 form a current mirror, and are configured to output a current to the output terminal 241 at a predetermined current mirror ratio.

As described above, in the operating state, the MOS analog circuit 5a serves as a constant current circuit configured to output the current, which is based on a current value of the constant current source 211, to the output terminal 241.

Here, when the MOS analog circuit 5a is in the operating state, the gate-source voltage Vgs of each of the MOS transistors 221, 222, 223, and 224 is set to a voltage near Vth, which is determined by the current value of the constant current source 211 and by the expression (1) described above. Therefore, in this state, as in the related art, Vgs cannot be arbitrarily raised even when the power supply voltage is changed.

Meanwhile, when the control signal CONT1 is an OFF signal, the switching circuits 231 and 232 are both turned off to place the MOS analog circuit 5a in a test state.

In the test state, the switching circuits 231 and 232 are turned off. Therefore, all of the nMOS transistors 221 and 222 and the pMOS transistors 223 and 224 do not operate as the current mirror.

In the test state, gate potentials of the nMOS transistors 221 and 222 are raised to a potential of the power supply terminal 2. As a result, the voltage between the power supply terminal 2 and the reference terminal 1 is applied between the gate and the source of each of the nMOS transistors 221 and 222, to turn on the nMOS transistors 221 and 222. Further, the gate potentials of the pMOS transistors 223 and 224 are dropped to a potential of the reference terminal 1 because the nMOS transistor 222 is turned on. Therefore, the voltage between the power supply terminal 2 and the reference terminal 1 is applied between the gate and the source of each of the pMOS transistors 223 and 224, to also turn on the pMOS transistors 223 and 224.

At this time, a current path between the power supply terminal 2 and the reference terminal 1 is blocked. Therefore, in a normal circuit, almost no current flows between the power supply terminal 2 and the reference terminal 1.

As described above, in the test state, the voltage between the power supply terminal 2 and the reference terminal 1, which is a high voltage, can be applied between the gate and the source of each MOS transistor, instead of the voltage near Vth. As a result, in the burn-in step, the high electrical field can be simultaneously applied to each gate oxide film, to enable the defects to be easily revealed in a short period of time. Further, the leakage current of the gate oxide film can be detected by measuring the current flowing between the power supply terminal 2 and the reference terminal 1, thereby enabling the failure to be detected with high sensitivity.

Figure 3:
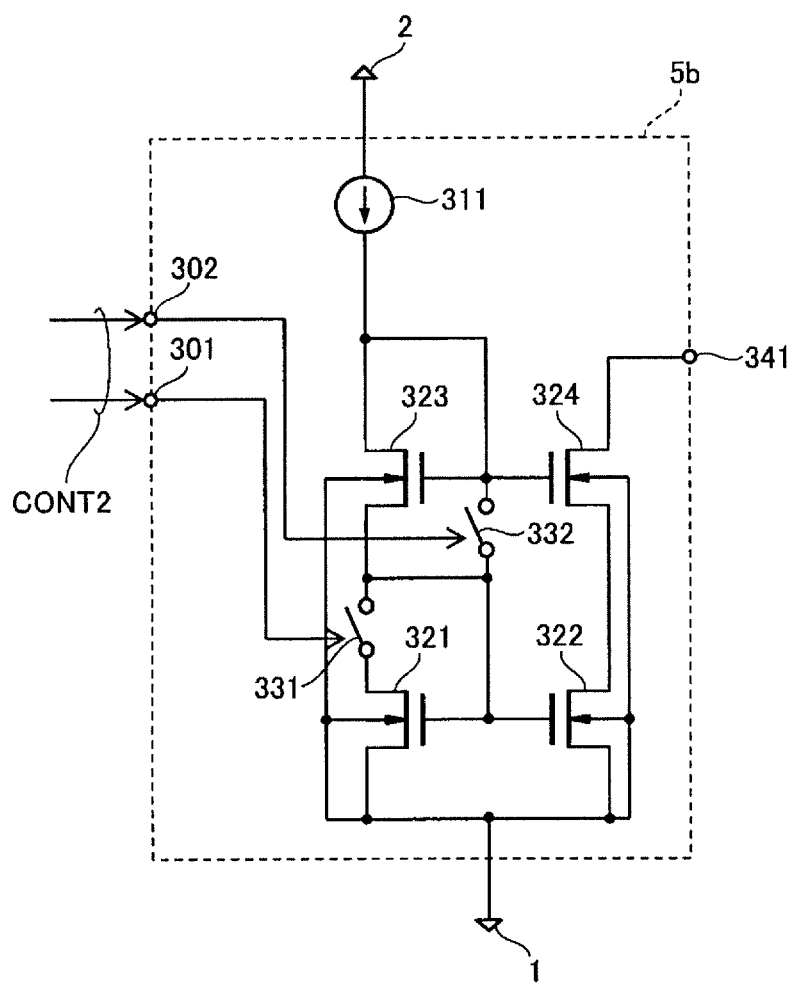
FIG. 3 is a circuit diagram for illustrating a MOS analog circuit 5b, which is another example of the MOS analog circuit of the semiconductor device of FIG. 1.

FIG. 3 is a circuit diagram for illustrating a MOS analog circuit 5b, which is another example of the MOS analog circuit 5 of the semiconductor device of FIG. 1.

The MOS analog circuit 5b of FIG. 3 includes control input terminals 301 and 302, a constant current source 311, nMOS transistors 321, 322, 323, and 324, switching circuits 331 and 332, and an output terminal 341.

The constant current source 311, the nMOS transistor 323, the switching circuit 331, and the nMOS transistor 321 are connected in series between the power supply terminal 2 and the reference terminal 1. The nMOS transistor 324 and the nMOS transistor 322 are connected in series between the output terminal 341 and the reference terminal 1.

Further, a gate of the nMOS transistor 321 and a gate of the nMOS transistor 322 are connected to a node between the nMOS transistor 323 and the switching circuit 331. A gate of the nMOS transistor 323 and a gate of the nMOS transistor 324 are connected to a node between the constant current source 311 and the nMOS transistor 323. The switching circuit 332 has one end connected to the gates of the nMOS transistors 323 and 324, and another end connected to the gates of the nMOS transistors 321 and 322.

A control signal CONT2 is input to the control input terminals 301 and 302 from the OFF control circuit 4 illustrated in FIG. 1, and the switching circuits 331 and 332 are controlled to be turned on and off through the control signal CONT2.

When the control signal CONT2 is an ON signal, the switching circuit 331 is turned on and the switching circuit 332 is turned off, to thereby place the MOS analog circuit 5b in an operating state.

In the operating state, a current of the constant current source 311 is output to the output terminal 341 at a predetermined current mirror ratio through a current mirror formed of the nMOS transistors 321 and 322. Further, the nMOS transistors 323 and 324 are configured to operate as a cascode circuit and a change in Vds of the nMOS transistors 321 and 322 is suppressed, to thereby enhance the current ratio accuracy of the current mirror.

As described above, in the operating state, the MOS analog circuit 5b serves as a constant current circuit configured to accurately output the current, which is based on a current value of the constant current source 311, to the output terminal 341.

Here, when the MOS analog circuit 5b is in the operating state, the gate-source voltage Vgs of each of the MOS transistors 321, 322, 323, and 324 is set to a voltage near Vth, which is determined by the current value of the constant current source 311 and by the expression (1) described above. Therefore, in this state, Vgs cannot be arbitrarily raised even when the power supply voltage is changed.

Meanwhile, when the control signal CONT2 is an OFF signal, the switching circuit 331 is turned off and the switching circuit 332 is turned on, to thereby place the MOS analog circuit 5b in a test state.

In the test state, the switching circuit 331 is turned off. Therefore, the nMOS transistors 321 and 322 do not operate as the current mirror.

In the test state, the gate potentials of the nMOS transistors 321, 322, 323, and 324 are raised to the potential of the power supply terminal 2. As a result, the voltage between the power supply terminal 2 and the reference terminal 1 is applied between the gate and the source of each of the nMOS transistors 321 and 322, to turn on the nMOS transistors 321 and 322.

At this time, a current path between the power supply terminal 2 and the reference terminal 1 is blocked. Therefore, in a normal circuit, almost no current flows between the power supply terminal 2 and the reference terminal 1.

As described above, in the test state, the voltage between the power supply terminal 2 and the reference terminal 1, which is a high voltage, can be applied between the gate and the source of each of the MOS transistors 321 and 322, instead of the voltage near Vth. Further, the MOS transistors 323 and 324 are not turned on because the voltage of the power supply terminal 2 is applied to both of the gate and the source of each of the MOS transistors 323 and 324. However, the MOS transistors 323 and 324 each has a bulk having the potential of the reference terminal 1, and thus the high voltage between the power supply terminal 2 and the reference terminal 1 is applied between the gate and the bulk thereof. As a result, each gate oxide film of the nMOS transistors 321, 322, 323, and 324 can be simultaneously applied with the high electrical field, and the effect similar to the example of FIG. 2 can thus be achieved.

As described above with reference to FIG. 2 and FIG. 3, even when the configuration of the current mirror is changed, the present invention can be applied and a similar effect can be achieved.

Figure 4:
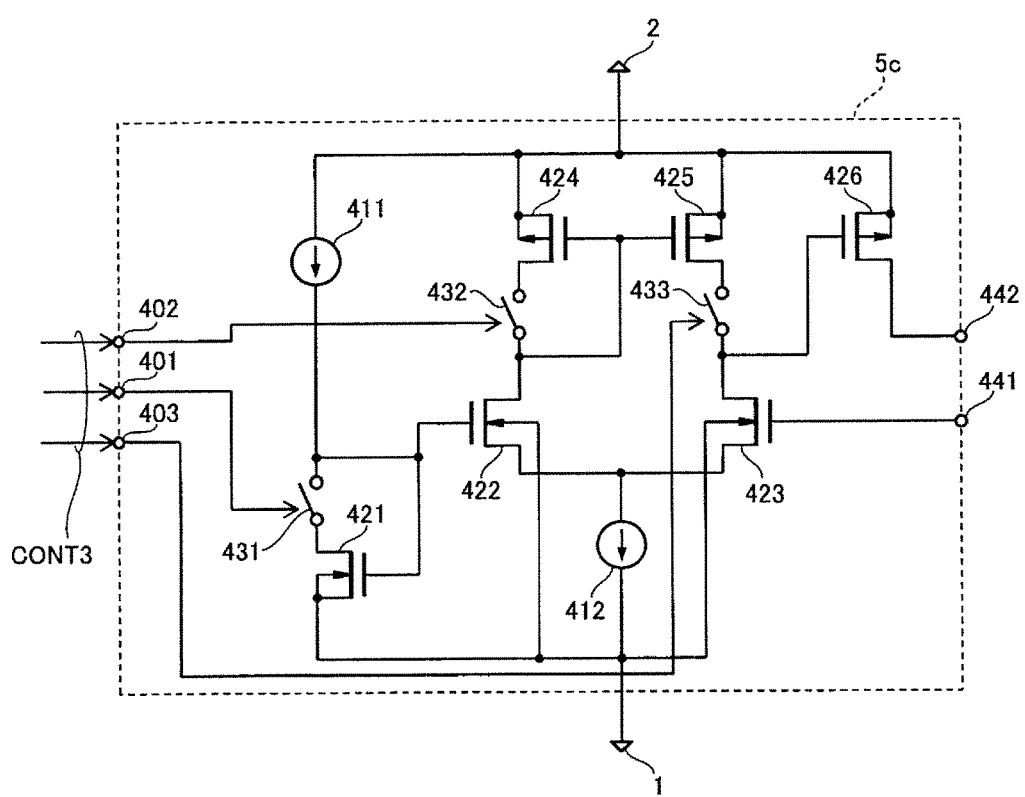
FIG. 4 is a circuit diagram for illustrating a MOS analog circuit 5c, which is yet another example of the MOS analog circuit of the semiconductor device of FIG. 1.
Figure 5:
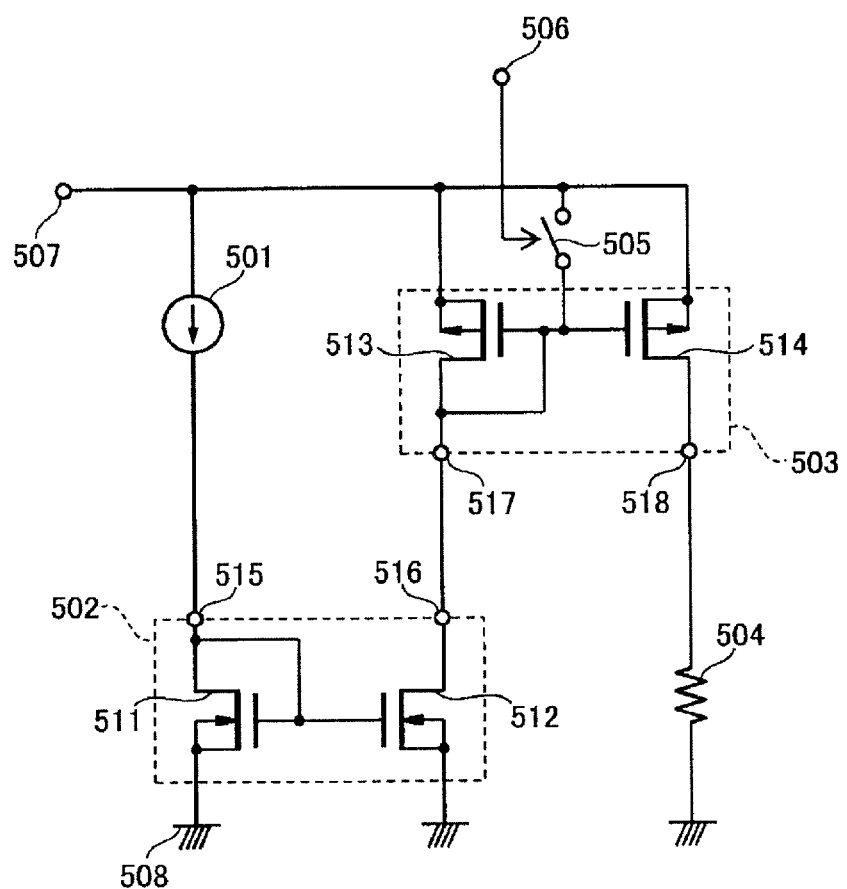
FIG. 5 is a circuit diagram for illustrating a related-art MOS analog circuit.

FIG. 4 is a circuit diagram for illustrating a MOS analog circuit 5c, which is still another example of the MOS analog circuit of the semiconductor device of FIG. 1.

The MOS analog circuit 5c of FIG. 4 includes control input terminals 401, 402, and 403, constant current sources 411 and 412, nMOS transistors 421, 422, and 423, pMOS transistors 424, 425, and 426, switching circuits 431, 432, and 433, an input terminal 441, and an output terminal 442.

The constant current source 411, the switching circuit 431, and the nMOS transistor 421 are connected in series between the power supply terminal 2 and the reference terminal 1. The pMOS transistor 424, the switching circuit 432, and the nMOS transistor 422 are connected in series between the power supply terminal 2 and the one end of the constant current source 412. The pMOS transistor 425, the switching circuit 433, and the nMOS transistor 423 are connected in series between the power supply terminal 2 and one end of the constant current source 412. Another end of the constant current source 412 is connected to the reference terminal 1. The pMOS transistor 426 has a source connected to the power supply terminal 2, a drain connected to the output terminal 442, and a gate connected to a node between the switching circuit 433 and the nMOS transistor 423.

Further, a gate of the nMOS transistor 421 and a gate of the nMOS transistor 422 are connected to a node between the constant current source 411 and the switching circuit 431. A gate of the pMOS transistor 424 and a gate of the pMOS transistor 425 are connected to a node between the switching circuit 432 and the nMOS transistor 422. A gate of the nMOS transistor 423 is connected to the input terminal 441.

A control signal CONT3 is input to the control input terminals 401, 402, and 403 from the OFF control circuit 4 illustrated in FIG. 1, and the switching circuits 431, 432, and 433 are controlled to be turned on and off through the control signal CONT3.

When the control signal CONT3 is an ON signal, the switching circuits 431, 432, and 433 are all turned on to place the MOS analog circuit 5c in an operating state.

In the operating state, the current of the constant current source 411 flows to the nMOS transistor 421, and a constant voltage referring to the reference terminal 1, in other words, the reference voltage is generated on the gate of the nMOS transistor 422. The nMOS transistors 422 and 423 form a differential pair of amplifiers and are biased by a current of the constant current source 412. Further, the pMOS transistors 424 and 425 serve as a load of the amplifiers, such that the nMOS transistors 422 and 423 output a signal, which is generated by amplifying a difference between the voltage of the input terminal 441 and the reference voltage, to a gate of the pMOS transistor 426. The pMOS transistor 426 is configured to convert the output voltage of the amplifiers into a current, to thereby output the converted current to the output terminal 442.

As described above, in the operating state, the MOS analog circuit 5c serves as a reference voltage circuit configured to generate a constant voltage by the constant current source 411 and the nMOS transistor 431, and as an amplifier configured to amplify the difference between the reference voltage and the voltage of the input terminal 441, to thereby output the amplified difference to the output terminal 442.

Here, when the MOS analog circuit 5c is in the operating state, the gate-source voltage Vgs of the nMOS transistor 421 of the reference voltage circuit is set to a voltage near Vth, which is determined by a current value of the constant current source 411 and by the expression (1) described above. Similarly, each of the MOS transistors 422, 423, 424, and 425 of the amplifier is set to a voltage near Vth, which is determined by a current value of the constant current source 412 and by the expression (1). Therefore, in this state, even when the power supply voltage is changed, Vgs cannot be arbitrarily raised.

Meanwhile, when the control signal CONT3 is an OFF signal, the switching circuits 431, 432, and 433 are all turned off to place the MOS analog circuit 5c in a test state.

In the test state, the constant current source 411 and the nMOS transistor 421 do not operate as the reference voltage circuit, and the nMOS transistors 422 and 423 and the pMOS transistors 424 and 425 do not operate as the amplifier either.

In the test state, the gate potentials of the nMOS transistors 421 and 422 are raised to the potential of the power supply terminal 2. As a result, the voltage between the power supply terminal 2 and the reference terminal 1 is applied between the gate and the source of each of the nMOS transistors 421 and 422. Here, a voltage equivalent to the power supply voltage of the power supply terminal 2 is input to the input terminal 441 such that the voltage between the power supply terminal 2 and the reference terminal 1 is also applied between the gate and the source of the nMOS transistor 423. As a result, the nMOS transistors 421, 422, and 423 are turned on. Further, the gate potentials of the pMOS transistors 424, 425, and 426 are dropped to the potential of the reference terminal 1 by the constant current source 412. Therefore, the voltage between the power supply terminal 2 and the reference terminal 1 is applied between the gate and the source of each of the pMOS transistors 424, 425, and 426, to also turn on the pMOS transistors 424, 425, and 426.

At this time, a current path between the power supply terminal 2 and the reference terminal 1 is blocked. Therefore, in a normal circuit, almost no current flows between the power supply terminal 2 and the reference terminal 1.

As described above, in the test state, the high voltage between the power supply terminal 2 and the reference terminal 1 can be applied between the gate and the source of each MOS transistor, instead of the voltage near Vth. As a result, there can be achieved the effect similar to that of the examples illustrated in FIG. 2 and FIG. 3.

The current mirror circuit of FIG. 2 and FIG. 3, and the reference voltage circuit and the amplifier included in FIG. 4 have configurations that are generally used. Therefore, the present invention can be applied to other MOS analog circuits that may easily be envisaged by a person skilled in the art, and a similar effect can be achieved. Further, in the examples of FIG. 2, FIG. 3, and FIG. 4, the number of control input terminals and switching circuits is determined based on each circuit configuration, but the number of control input terminals and the number of switching circuits may be changed based on the circuit configuration to be applied.

Further, according to the present invention, even in a large-scale circuit using a plurality of different types of circuits, all of the MOS transistors can be controlled simultaneously, and thus the defects can be revealed and the failure can be detected with a low manufacturing cost and without a long testing time.

As described above, according to the semiconductor device including the analog circuit including the MOS transistor of the present invention, the defects of the gate oxide film can be easily revealed by the high electrical field, and thus the low manufacturing cost and the high reliability can be achieved.

What is claimed is:

1. A semiconductor device, comprising:
a MOS analog circuit comprising a MOS transistor; and
a power supply terminal and a reference terminal for supplying a voltage to the MOS analog circuit,
wherein the MOS analog circuit is configured to switch to one of a test state and an operating state based on a control signal that is externally supplied, and
wherein, in the test state, a current path formed, when the MOS transistor is turned on, between the power supply terminal and the reference terminal is blocked, and a voltage between the power supply terminal and the reference terminal is applied to a gate oxide film of the MOS transistor.

2. A semiconductor device according to claim 1, wherein the MOS analog circuit further comprises:
a switching circuit; and
a constant current source,
wherein, in the test state, a drain terminal of the MOS transistor is placed in an open state when the switching circuit is turned off, and
wherein, in the operating state, a current based on an output current of the constant current source is supplied to the drain terminal of the MOS transistor when the switching circuit is turned on.

3. A method of inspecting a semiconductor device,
the semiconductor device comprising:
a MOS analog circuit comprising a MOS transistor; and
a power supply terminal and a reference terminal for supplying a voltage to the MOS analog circuit,
the method comprising:
switching, based on a control signal that is externally supplied, the MOS analog circuit to a test state in which a current path formed, when the MOS transistor is turned on, between the power supply terminal and the reference terminal is blocked, and a voltage between the power supply terminal and the reference terminal is applied to a gate oxide film of the MOS transistor;
measuring a current flowing between the power supply terminal and the reference terminal; and
detecting failure of the semiconductor device.

* * * * *